United States Patent
Chung et al.

(10) Patent No.: US 8,102,481 B2
(45) Date of Patent: Jan. 24, 2012

(54) ARRAY SUBSTRATE OF LIQUID CRYSTAL DISPLAY

(75) Inventors: Te-Chen Chung, Kun Shan (CN); Tean-Sen Jen, Kun Shan (CN); Yu-Wen Chiu, Kun Shan (CN); Chia-Te Liao, Kun Shan (CN)

(73) Assignee: Infovision Optoelectronics (Kunshan) Co., Ltd., Kunshan (CN)

( * ) Notice: Subject to any disclaimer, the term of this patent is extended or adjusted under 35 U.S.C. 154(b) by 458 days.

(21) Appl. No.: 12/350,953

(22) Filed: Jan. 8, 2009

(65) Prior Publication Data
US 2009/0322977 A1  Dec. 31, 2009

(30) Foreign Application Priority Data
Jun. 25, 2008  (CN) .......................... 2008 1 0125797

(51) Int. Cl.
*G02F 1/1333*  (2006.01)
(52) U.S. Cl. ........................................................ 349/54
(58) Field of Classification Search ...................... 349/54
See application file for complete search history.

(56) References Cited

U.S. PATENT DOCUMENTS

| | | | |
|---|---|---|---|
| 6,839,099 B2 * | 1/2005 | Fukunishi | 349/54 |
| 6,943,374 B1 | 9/2005 | Park | |
| 7,417,694 B2 * | 8/2008 | Kim et al. | 349/44 |
| 2005/0174503 A1 | 8/2005 | Kim et al. | |
| 2008/0309839 A1 | 12/2008 | Kim et al. | |

FOREIGN PATENT DOCUMENTS

| | | |
|---|---|---|
| CN | 1652002 A | 8/2005 |
| CN | 1264135 C | 7/2006 |

* cited by examiner

*Primary Examiner* — James Dudek
(74) *Attorney, Agent, or Firm* — Perkins Coie LLP; Aaron Wininger

(57) ABSTRACT

An array substrate of a liquid crystal display, comprising a first scan line and a second scan line, a first data line and a second data line arranged crossing with the first scan line and the second scan line to define a pixel region, and a pixel electrode in the pixel region, wherein the second data line comprises at least a first branch and a second branch that are electrically connected to each other. According to the invention, it is not necessary to provide the array substrate with additional space for disposing repair lines, and the non-display region is therefore not increased, resulting in an increased yield. Only a short length of repair lines is used in repair, and thus both electrical resistance of repair line and distortion of data signals can be reduced.

18 Claims, 9 Drawing Sheets

US 8,102,481 B2

ARRAY SUBSTRATE OF LIQUID CRYSTAL DISPLAY

FIELD OF THE INVENTION

The present invention relates to an array substrate of a liquid crystal display (LCD), and in particular, to an array substrate of a liquid crystal display having a repair line structure.

BACKGROUND

Liquid crystal displays are advantageous in being light, thin and low in power consumption, and have been widely used in modern information devices such as notebook computers, mobile phones, and personal digital assistants (PDAs).

FIG. 1 is a schematic view of a conventional array substrate of a liquid crystal display. The array substrate 110 of the liquid crystal display comprises a signal introducing region 111 and a display region 112. Data line pads 121 and scan line pads 131 are formed in the signal introducing region 111. Data lines 122 and scan lines 132 are connected respectively to the data line pads 121 and the scan line pads 131, and crossing regions between the data lines 122 and the scan lines 132 define a plurality of pixels P. External data signals and scan signals are inputted via the data line pads 121 and the scan line pads 131, and then transmitted to the respective pixels P through the data lines 122 and the scan lines 132.

During the process of forming the conventional array substrate of the liquid crystal display, defects such as breaking may occur in the data lines. For example, as shown in FIG. 1, the data line 122 is broken at a location D3 in the display region 112. In this case, data signals cannot be transmitted to the portion of the data line past the breaking point D3, which causes a line defect.

In order to repair the line defect, a conventional repair structure is provided. As shown in FIG. 2, a data line 122 comprises three portions, that is, a front data line portion 122a outside the display region for connecting with the data line pad 121, a display region data line portion 122b, and an end data line portion 122c outside the display region on a side away from the data line pad 121. In addition, repair lines 223 are provided peripheral to the display region 112 in the liquid crystal display, and arranged across the front data line portions 122a and the end data line portions 122c orthogonally. However, the repair lines 223 and the data lines 122 are provided in different layers and have an insulating layer in between so that they are not in connection normally.

When a break occurs at D4 as shown in FIG. 2, the front data line portion 122a and a repair line 223 are connected at the crossing point A, and the end data line portion 122c and the repair line 223 are connected at the crossing point B by laser melting. As a result, data signals on the data line can be transmitted to the repair line 223 via the point A from the front data line portion 122a and then to the data line under the breaking point D4 via the point B, and thus the line defect is repaired.

However, there are some problems in such a repair structure. For example, the array substrate has to be provided with some space for disposing the repair lines, thereby causing an area of a non-display region to increase. Moreover, when using the repair lines described above to perform repair, the repair lines per se have relative large resistance, and may cause distortion of the data signals.

SUMMARY

An embodiment of the invention provides an array substrate of liquid crystal display comprising a first scan line and a second scan line, a first data line and a second data line arranged crossing with the first scan line and the second scan line to define a pixel region, and a pixel electrode in the pixel region. The second data line comprises at least a first branch and a second branch electrically connected.

Another embodiment of the invention provides a liquid crystal display comprising a plurality of scan lines and data lines crossing with each other and defining a plurality of pixel regions, and a plurality of pixel electrodes in the plurality of pixel regions. The data line comprises at least two branches electrically connected with each other.

According to the invention, it is not necessary to provide the array substrate with space for disposing repair lines, and accordingly the non-display region is not increased resulting in an increased yield. Only a short length of repair lines, which may be less than a perimeter of one pixel, is used in repair, and thus both electrical resistance of repair line and distortion of data signals can be reduced. Moreover, the repair lines can be disposed in parallel or substantially parallel with the scan lines, and can be electrically connected with the scan lines to function as a part of the scan lines when repair is not carried out, so the electrical resistance of scan lines is reduced.

BRIEF DESCRIPTION OF THE DRAWINGS

From the following detailed description to the embodiments, accompanying with the drawings, the present invention will be more apparent. In the drawings.

DETAILED DESCRIPTION OF EMBODIMENTS

Figure 1:
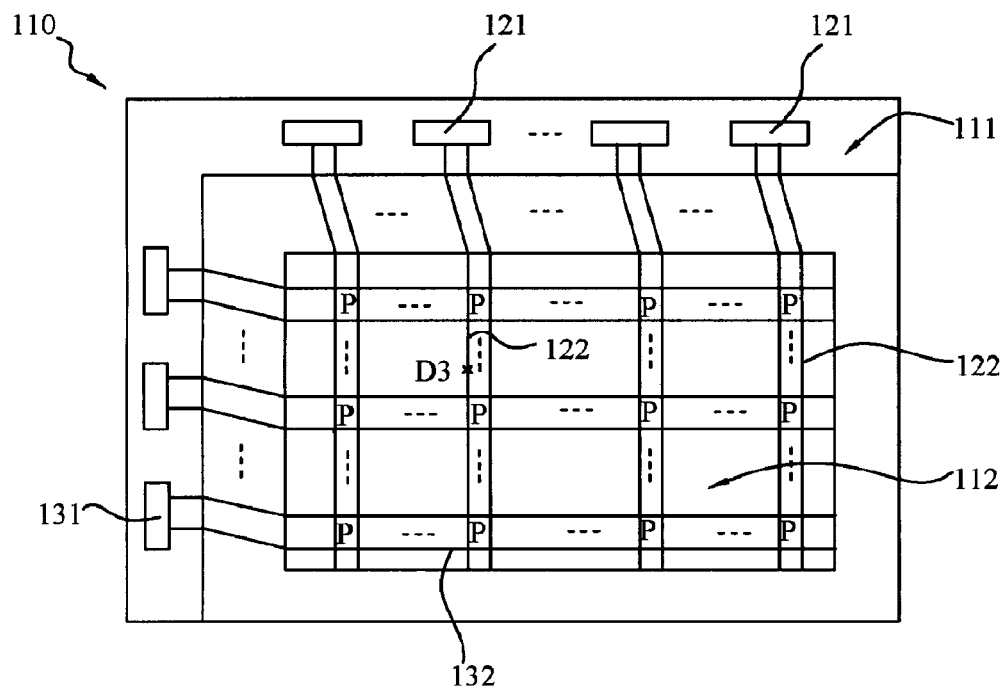
FIG. 1 shows a schematic view of a conventional array substrate of a liquid crystal display.
Figure 2:
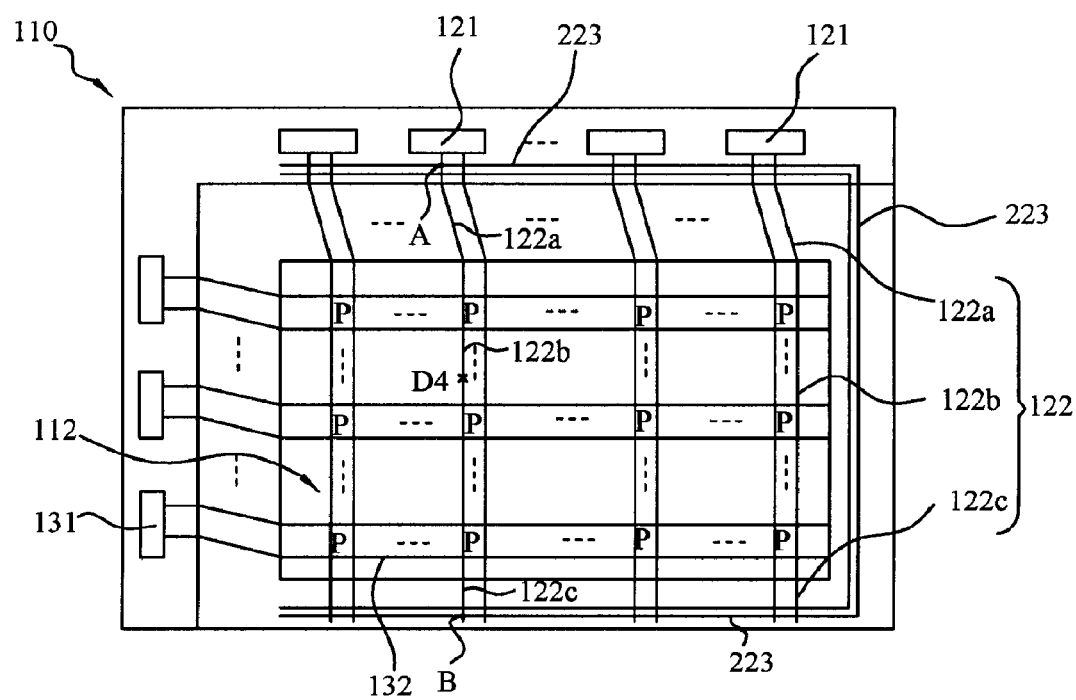
FIG. 2 shows a repair structure for the array substrate of FIG. 1.

Illustrative embodiments of the invention will be described in the following with reference to the accompany drawings. In the present application, directional terms "upper", "lower", "left" and "right" or the like are used with respect to the specific embodiments shown in the drawings, and may vary depending on various implementations.

Figure 3:
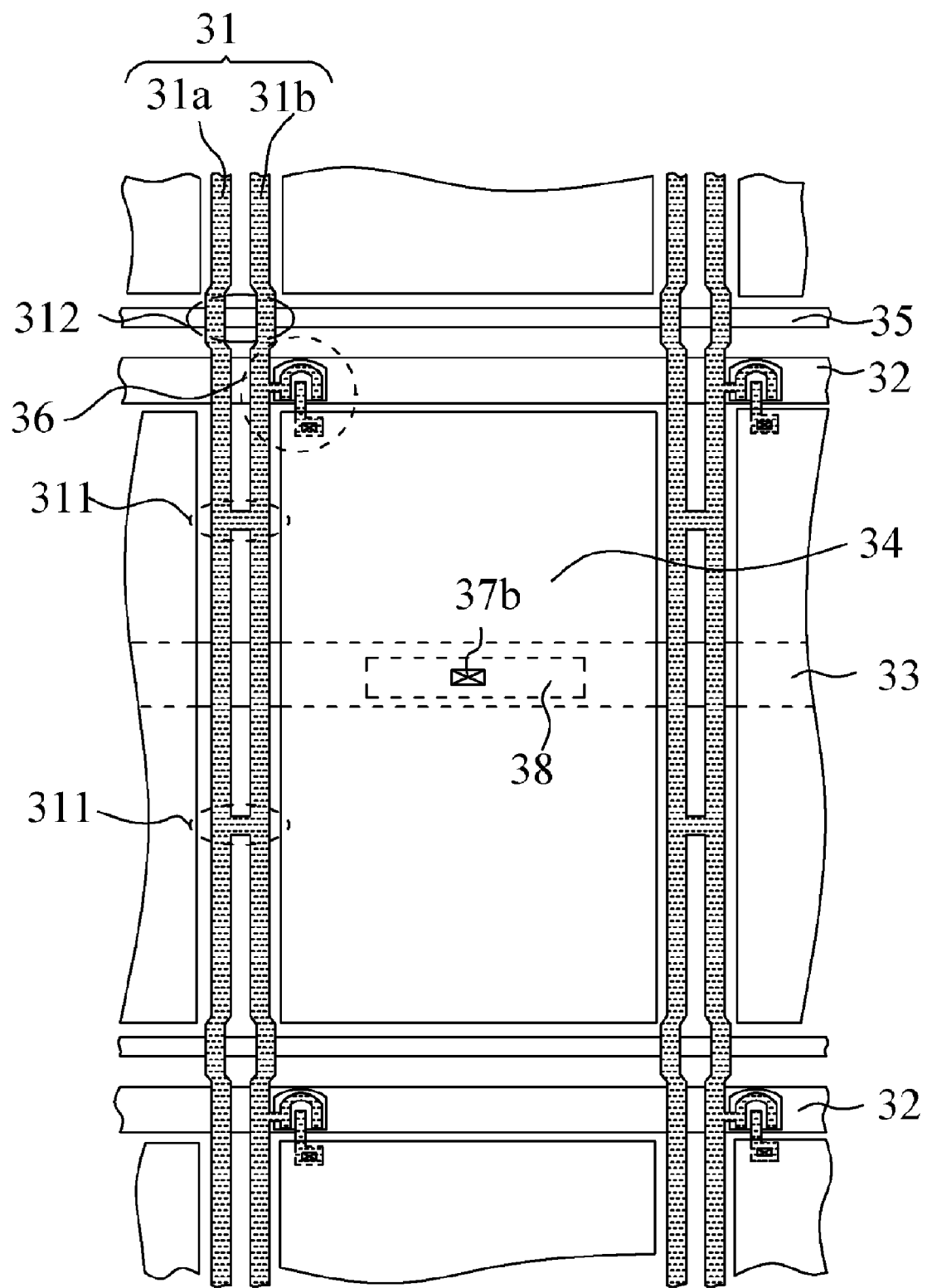
FIG. 3 is a plan view of a portion of an array substrate of a liquid crystal display in accordance with a first embodiment of the invention showing a repair line structure on the array substrate.

FIG. 3 is a plan view of a portion of an array substrate of a liquid crystal display in accordance with a first embodiment of the invention showing a repair line structure on the array substrate. The array substrate comprises a plurality of data lines 31 and a plurality of scan lines 32 crossing with each other to form a plurality of pixel regions. In each pixel region, a pixel electrode 34 is formed, and a thin film transistor (TFT) 36 is formed adjacent to the crossing point of a data line 31 and a scan line 32. A storage capacitor electrode 33 is provided in parallel to the scan line 32 and underneath the layer in which the pixel electrode 34 resides, and forms a storage capacitor for the pixel region along with the pixel electrode 34. In an embodiment, an auxiliary metal layer 38 is electrically connected with the pixel electrode 34 via a through-hole 37b that may be provided between the storage capacitor electrode 33 and the pixel electrode 34 in order to increase the capacitance of the storage capacitor. Functions and operation manners of a storage capacitor is well known in the art and thus will not be discussed herein. FIG. 3 shows the situation adjacent to a single pixel region. However, those of ordinary skill in the art will know that the array substrate typically comprises a number of pixel regions which may have a structure similar to that shown in FIG. 3.

As shown in FIG. 3, in the present embodiment, each data line 31 comprises a plurality of branches. It is noted that although the data line 31 shown in FIG. 3 comprises two branches 31a and 31b, the data line 31 may comprise three, four or more branches. A first branch 31a and a second branch 31b of the data line 31 are electrically connected via a connection portion 311. The connection portion 311 is made of an electrically conductive material, which may be the same material as that for the first and second branches 31a and 31b of the data line 31, and can be formed in the same procedure as the two branches 31a and 31b of the data line 31 during manufacturing. In an embodiment, the connection portion 311 is provided at a position that does not overlap with the scan line 32 and the storage capacitor electrode 33, so as to prevent degradation of display quality due to forming a capacitor with the scan line 32 or the storage capacitor electrode 33. In addition, in the embodiment shown in FIG. 3, two connection portions 311 are provided corresponding to the data line 31 for one pixel, and are positioned respectively at both upper and lower sides of the storage capacitor electrode 33 in FIG. 3. However, the number of the connection portions 311 is not limited to two, but may be one or more.

As shown in FIG. 3, in the array substrate of the embodiment, a repair line 35 is provided crossing the data line 31 with an insulating layer in between. In an embodiment, the repair line 35 may be provided in the same layer as the scan line 32, and may extend in parallel or substantially parallel with the scan line 32, that is, in a non-intersecting manner. In an embodiment, the two branches 31a, 31b of the data line 31 have an increased separation distance at a position 312 where they cross the repair line 35, that is, the separation distance at that position is wider than at other positions on the data line 31 where the data line 31 does not cross the repair line 35. Moreover, FIG. 3 shows an embodiment in which one repair line 35 is provided between two adjacent pixels in a vertical direction; however, more repair lines 35 may be provided between the two adjacent pixels, and these repair lines may be either electrically connected to each other or mutually separated.

Figure 4:
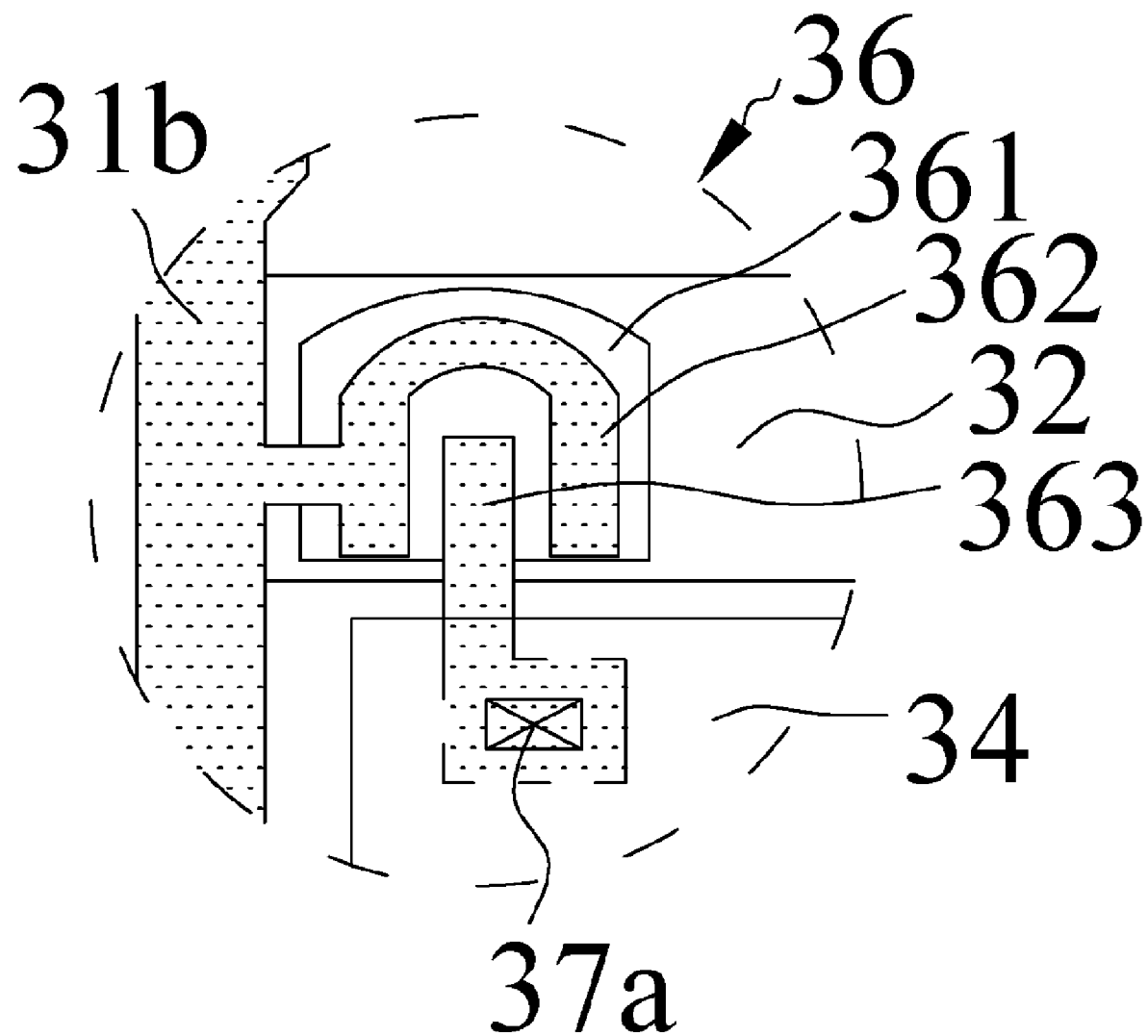
FIG. 4 is an enlarged view of a region in which a thin film transistor resides in FIG. 3.

FIG. 4 is an enlarged view showing the region where the TFT 36 is positioned. The TFT 36 comprises a gate electrode, a semiconductor layer 361, a source electrode 362 and a drain electrode 363. The gate electrode of the TFT 36 is electrically connected with the scan line 32, and in the embodiment shown in FIG. 4 is a part of the scan line 32. The source electrode 362 of the TFT 36 is electrically connected with the data line 31, and in the embodiment shown in FIG. 4 is connected with the second branch 31b of the data line 31. The drain electrode 363 of the TFT 36 is electrically connected with the pixel electrode 34 via a through hole 37a. It is apparent to those of ordinary skill in the art that, although the TFT 36 is used in the embodiment to control the pixel electrode, other switching elements known in the art may be used in place of the TFT 36 to carry out the invention.

Figure 5A:
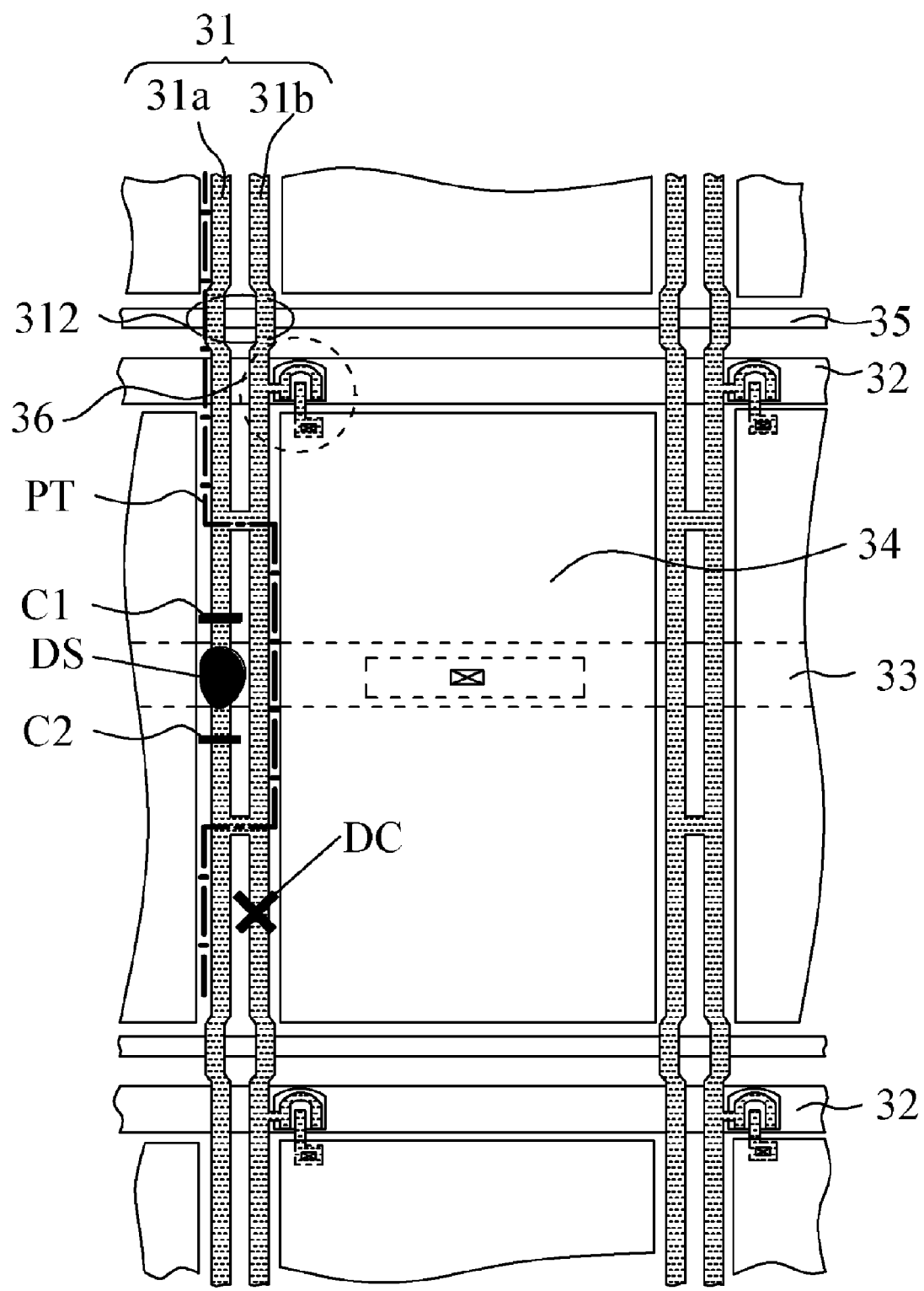
FIGS. 5A and 5B show how the array substrate in accordance with the first embodiment of the invention is repaired when a defect occurs in a data line.

In the embodiment, the data line 31 is provided with two branches 31a and 31b. Normally, both of the two branches 31a and 31b are configured to transmit data signals on the data line 31. If a breaking defect occurs in one of the two branches 31a and 31b of the data line 31 due to a line defect in a manufacturing process of the array substrate, for example at a point DC on the second branch 31b as shown in FIG. 5A, the liquid crystal display can still work properly without being repaired since another branch of the data line 31 remains in normal electrical connection. If a shorting defect occurs in one of the two branches 31a and 31b of the data line 31, for example at a point DS where the first branch 31a crosses the storage capacitor electrode 33 as shown in FIG. 5A, the portion where the shorting defect occurs may be cut off from other portions of that branch by laser, and the signal on the data line 31 can be transmitted through another branch. Even if both of the above defects occur in the different branches 31a and 31b of the data line 31, the signal on the data line 31 can still be transmitted in a circuitous manner through a plurality of connection portions 311, for example, in a transmission path PT as shown by the dash-dot line in FIG. 5A.

Figure 5B:
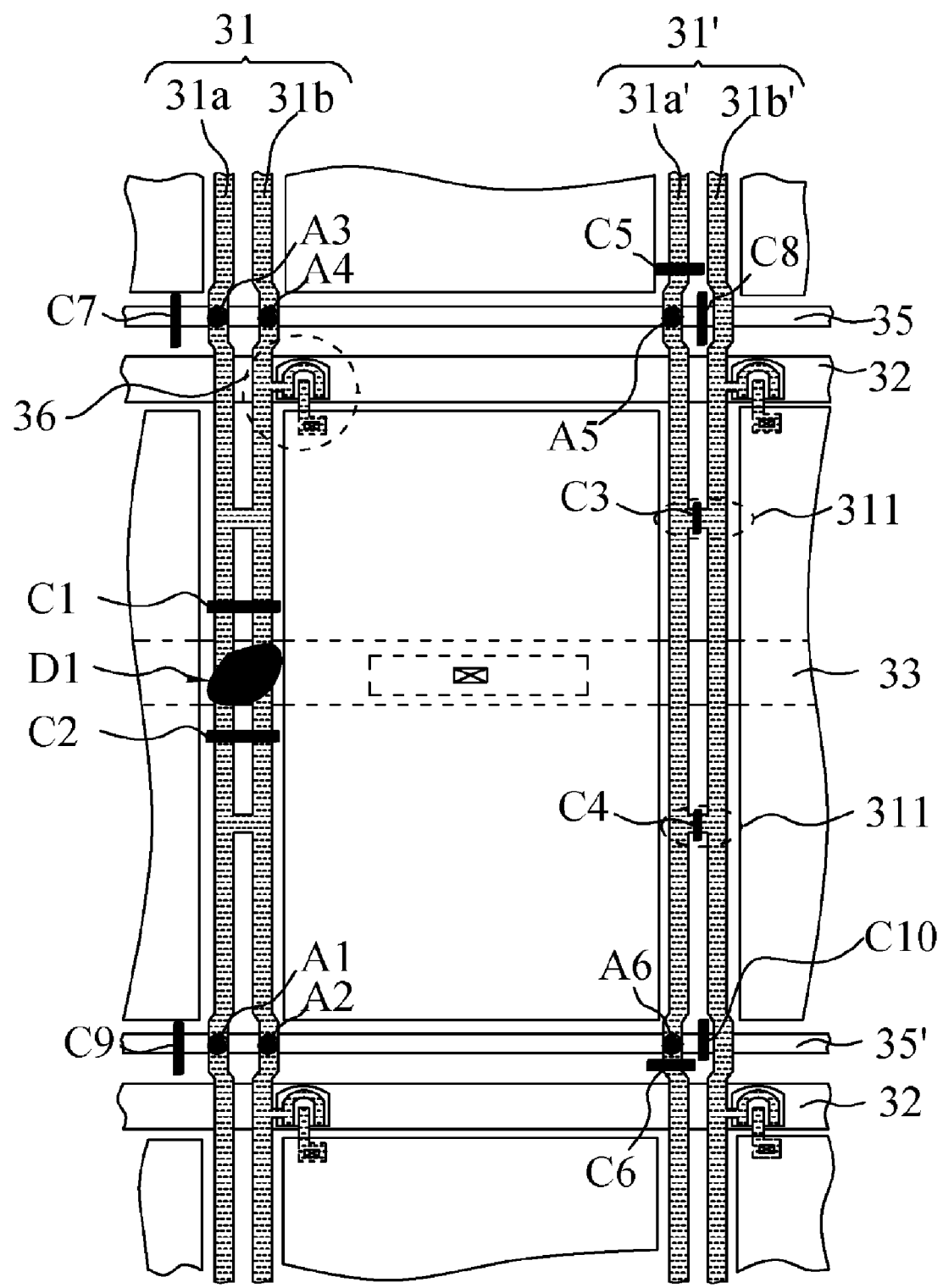

Furthermore, according to the embodiment of the invention, even when defects such as shorting or breaking occur in both of the branches 31a and 31b of the data line 31 between the two connection portion 311, the data line 31 can also be repaired. FIG. 5B shows the manner in which the data line 31 is repaired when defects (such as shorting with the storage capacitor electrode 33 or breaking) occur at a position D1 (referred to as "defect position D1" hereinafter) where both of the branches 31a and 31b of the data line 31 cross the storage capacitor electrode 33. In FIG. 5B, the data line in which a defect occurs will be referred to as a first data line 31, and the first and second branches thereof will be denoted with reference numbers 31a and 31b; the data line that is adjacent to the first data line 31 in the pixel will be referred to as a second data line 31', and the first and second branches thereof will be denoted with reference numbers 31a' and 31b'; the repair line adjacent to the defect position D1 and in its upper side will be referred to as a first repair line 35, and the repair line adjacent to the defect position D1 and in its lower side will be referred to as a second repair line 35'.

In repairing the defect at the defect position D1, for both branches of the data line 31, the portions at the defect position D1 are cut off from other portions. For example, in case that both branches 31a and 31b of the first data line 31 are short with the storage capacitor electrode 33 at the defect position D1 to cause a shorting defect, the first branch 31a and the second branch 31b of the first data line 31 are cut off at an upper position C1 and a lower position C2 of the defect position D1 by laser. In case that both branches 31a and 31b of the first data line 31 break at the defect position D1 to cause a breaking defect, since the branches have been broken, they may not subject to additional process, or may be cut off at the upper position C1 and the lower position C2 of the defect position D1 by laser, similar to the above process in handling the shorting defect, to better ensure that the defect position D1 is disconnected from other portions of the data line 31. For the situation shown in FIG. 5B, the defect position D1 is between the second repair line 35' and the position where the TFT 36 is connected to the first data line 31; in this case, the upper position C1 is between the defect position D1 and a position where the TFT is connected to the first data line 31, and the lower position C2 is between the defect position D1 and positions A1 and A2 where the first data line 31 crosses with the second repair line 35'. However, in case that the defect position D1 is between the first repair line 35 and a position where the TFT 36 is connected to the first data line 31, the upper position C1 will be between the defect position D1 and positions A3 and A4 where the first data line 31 crosses with the first repair line 35, and the lower position C2 will be between the defect position D1 and a position where the TFT is connected to the first data line 31.

In addition, the electrical connection between the first branch 31a' and the second branch 31b' of a section of the second data line 31' is cut off, the section being between the first repair line 35 and the second repair line 35'. For example, both connection portions 311 in the section of the second data line 31' between the first repair line 35 and the second repair line 35' are cut off by laser at positions C3 and C4.

Moreover, the first repair line 35 and the second repair line 35' are made electrically connected with the first data line 31 respectively. For example, by laser melting, the first data line 31 and the second repair line 35' are made electrically connected in at least one, and preferably both, of the position A1 where the first branch 31a of the first data line 31 crosses with the second repair line 35' and the position A2 where the second branch 31b of the first data line 31 crosses with the second repair line 35', and the first data line 31 and the first repair line 35 are made electrically connected in at least one, and preferably both, of the position A3 where the first branch 31a of the first data line 31 crosses with the first repair line 35 and the position A4 where the second branch 31b of the first data line 31 crosses with the first repair line 35.

Figure 9:
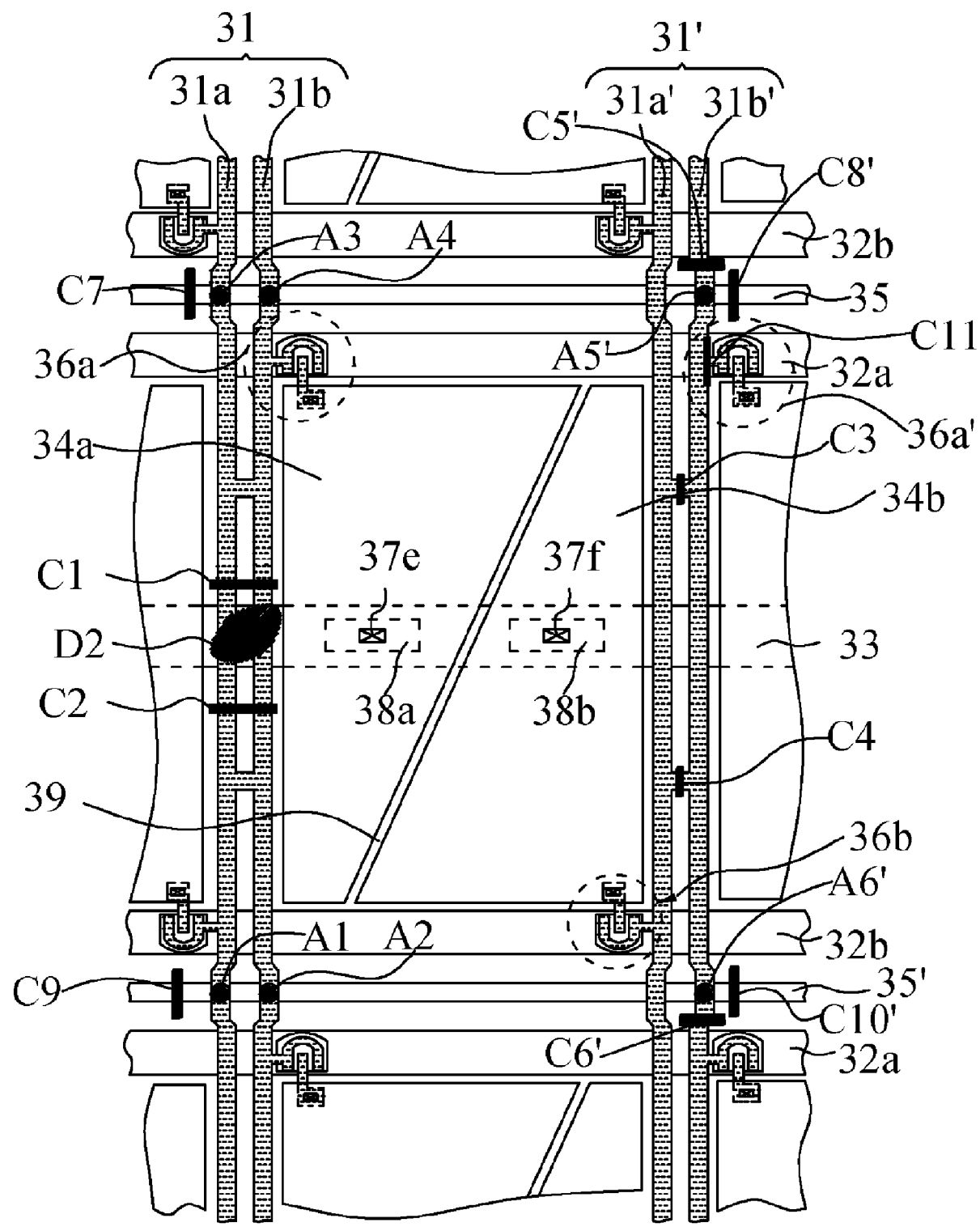
FIG. 9 shows how the array substrate in accordance with the second embodiment of the invention is repaired when a defect occurs in a data line.

Also, the first repair line 35 and the second repair line 35', respectively, are made electrically connected with one of the plurality of branches of the second data line 31'. For example, by laser melting, the first branch 31a' of the second data line 31' and the first repair line 35 are made electrically connected at a position A5 where the first branch 31a' of the second data line 31' crosses with the first repair line 35, and the first branch 31a' of the second data line 31' and the second repair line 35' are made electrically connected at a position A6 where the first branch 31a' of the second data line 31' crosses with the second repair line 35'. Alternatively, it is also possible that the second branch 31b' of the second data line 31' and the first repair line 35 are made electrically connected at a position where the second branch 31b' of the second data line 31' crosses with the first repair line 35, and the second branch 31b' of the second data line 31' and the second repair line 35' are made electrically connected at a position where the second branch 31b' of the second data line 31' crosses with the second repair line 35'. In the latter case of using the second branch 31b' of the second data line 31' in repair, the TFT which is originally connected to the second branch 31b' may have its source electrode cut off from the second branch 31b' to prevent the pixel that is connected with the drain electrode of the TFT from being affected; this is similar to the cutting at a position C11 as shown in FIG. 9 which will be described later.

In addition, the branch in the second data line 31' that is electrically connected with the first repair line 35 and the second repair line 35', which is the first branch 31a' in the case shown in FIG. 5B, is cut off at a position (e.g. a position C5 shown in FIG. 5B) above a position where it crosses with the first repair line 35 (e.g. the position A5 shown in FIG. 5B), and is cut off at a position (e.g. a position C6 shown in FIG. 5B) below the position where it crosses with the second repair line 35' (e.g. the position A6 shown in FIG. 5B).

In an embodiment, by laser for example, the first repair line 35 may be cut off at a position (e.g. a position C7 shown in FIG. 5B) left to the leftmost position (the position A3 in case of FIG. 5B) among the one or more positions where the first data line 31 is electrically connected with the first repair line 35, and the second repair line 35' may be cut off at a position (e.g. a position C9 shown in FIG. 5B) left to the leftmost position (the position A1 in case of FIG. 5B) among the one or more positions where the first data line 31 is electrically connected with the second repair line 35'. Furthermore, by laser for example, the first repair line 35 may be cut off at a position (e.g. a position C8 shown in FIG. 5B) right to the position (the position A5 in case of FIG. 5B) where the branch of the second data line 31' electrically connected to the first repair line 35 and the second repair line 35' (the first branch 31a' in case of FIG. 5B) crosses with the first repair line 35, and the second repair line 35' may be cut off at a position (e.g. a position C10 shown in FIG. 5B) right to the position (the position A6 in case of FIG. 5B) where the branch of the second data line 31' electrically connected to the first repair line 35 and the second repair line 35' crosses with the second repair line 35'. As a result, influence of parasitic capacitance, which may be generated between the first repair line 35/the second repair line 35' and other data lines, on signals is advantageously reduced, and, since only a portion of the first repair line 35 and a portion of the second repair line 35' as shown are used, other portions of the first repair line 35 and the second repair line 35' can still be used for repair if a defect occurs in other data lines in the array substrate.

With the manner described above, for the data line 31 in which the defect occurs, the portions upper and lower to the defect position D1 can be electrically connected through the first repair line 35, the first branch 31a' of the second data line 31' and the second repair line 35', and thus the defect is repaired.

It is noted that although the repairing method above is described as several steps for the convenience of explanation, the steps in the method is not necessarily carried out in sequence. That is, electrical connection operation at respective positions A1-A6, cutting off operation at respective positions C1-C6 and optional cutting off operation at respective positions C7-C10 may be carried out simultaneously, or in any order as required. To carry out repair, only at least one of the plurality of branches in the data line 31 where a defect occurs is required to be electrically connected with the first repair line 35 and the second repair line 35'; however, it is advantageous that both branches are electrically connected with the first repair line 35 and the second repair line 35' in order to minimize the electrical resistance of the repaired data line. In addition, FIG. 5B shows a repair by using the first branch 31a' of the second data line 31' which is adjacent to the first data line 31 having defect. However, it is also possible to carry out repair by using the second branch 31b' of the second data line 31'. As described above in connection to FIG. 3, the two branches 31a, 31b of the data line 31 may have an interval increased at a position 312 where they cross with the repair line 35, so as to facilitate electrically connecting either or both branches of the data line 31 to the repair line 35 for example by laser melting when carrying out repair as well as cutting off the repair line between the two branches 31a and 31b of the data line 31, without interfering or damaging any of the branches when laser melting is carried out.

A plurality of connection portions 311 between the two branches 31a and 31b of the data line 31 may improve an ability of repairing a plurality of defects that occur in the data line 31 as shown in FIG. 5A. However, since each connection portion 311 is to be cut off when repair is carried out as shown in FIG. 5B, if there are too many connection portions 311, cutting off process will have to be carried out at a number of positions, leading to an increase in time for repair. In an embodiment, the data line 31 (or 31') comprises one or two connection portions 311 between the positions where it crosses with the first repair line 35 and the second repair line 35'. However, it is not necessary that a connection portion 311 is provided for each pixel between the positions where the data line crosses with the first repair line 35 and the second repair line 35' for the pixel. For example, it is possible to provide a connection portion every one or several pixels.

Figure 6:
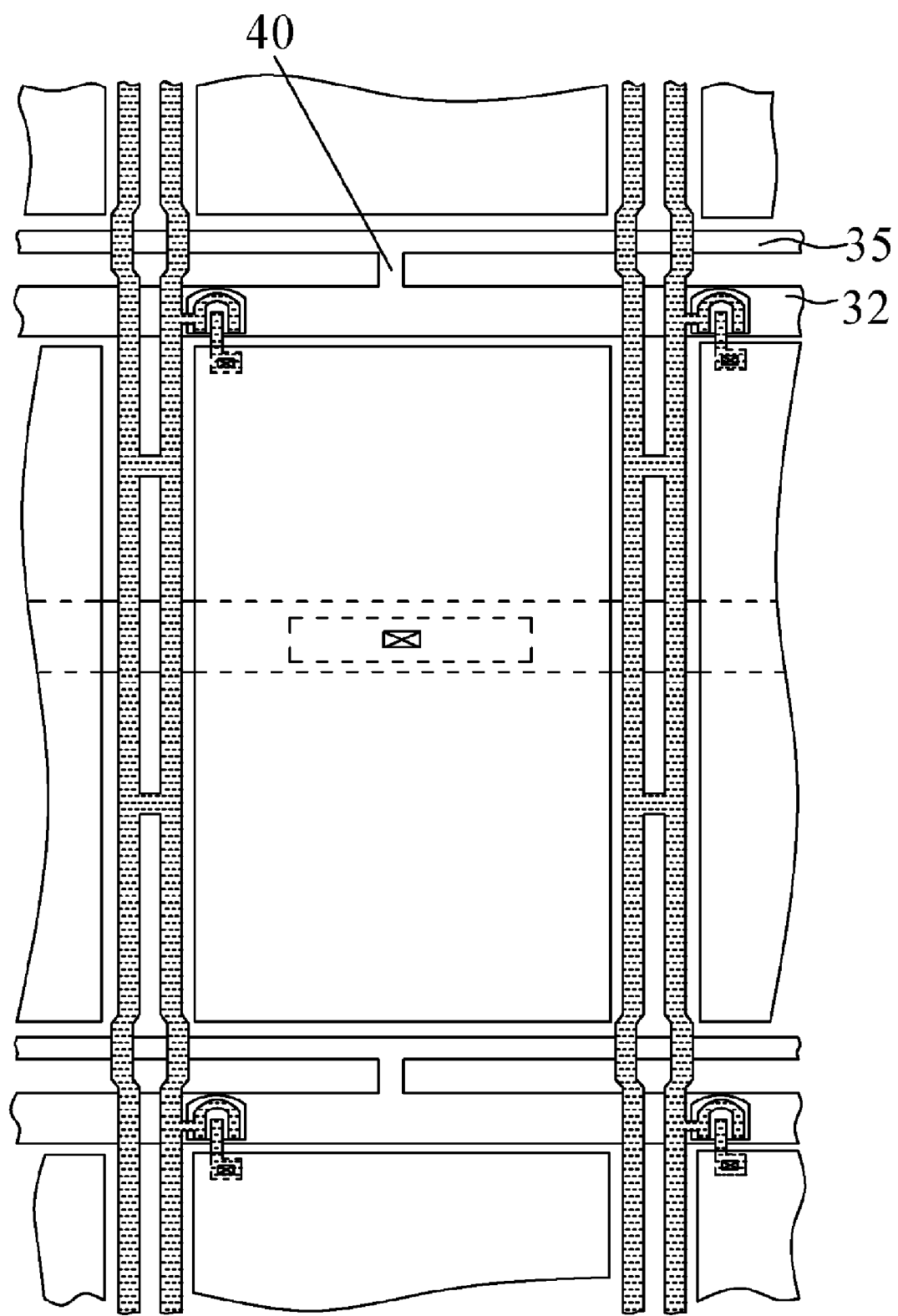
FIG. 6 shows a variation of the array substrate in accordance with the first embodiment of the invention.

FIG. 6 shows a variation of the array substrate according to the first embodiment of the invention. As shown in FIG. 6, the repair line 35 and the scan line 32 are electrically connected together with an additional connection portion 40 formed with a conductive material. The additional connection portion 40 is cut off by for example laser merely when the repair line 35 is used to carry out repair as shown in FIG. 5B. Thus when the array substrate operates normally, the repair line 35 and the scan line 32 is connected in parallel and the electrical resistance of the scan line 32 can be reduced.

Figure 7:
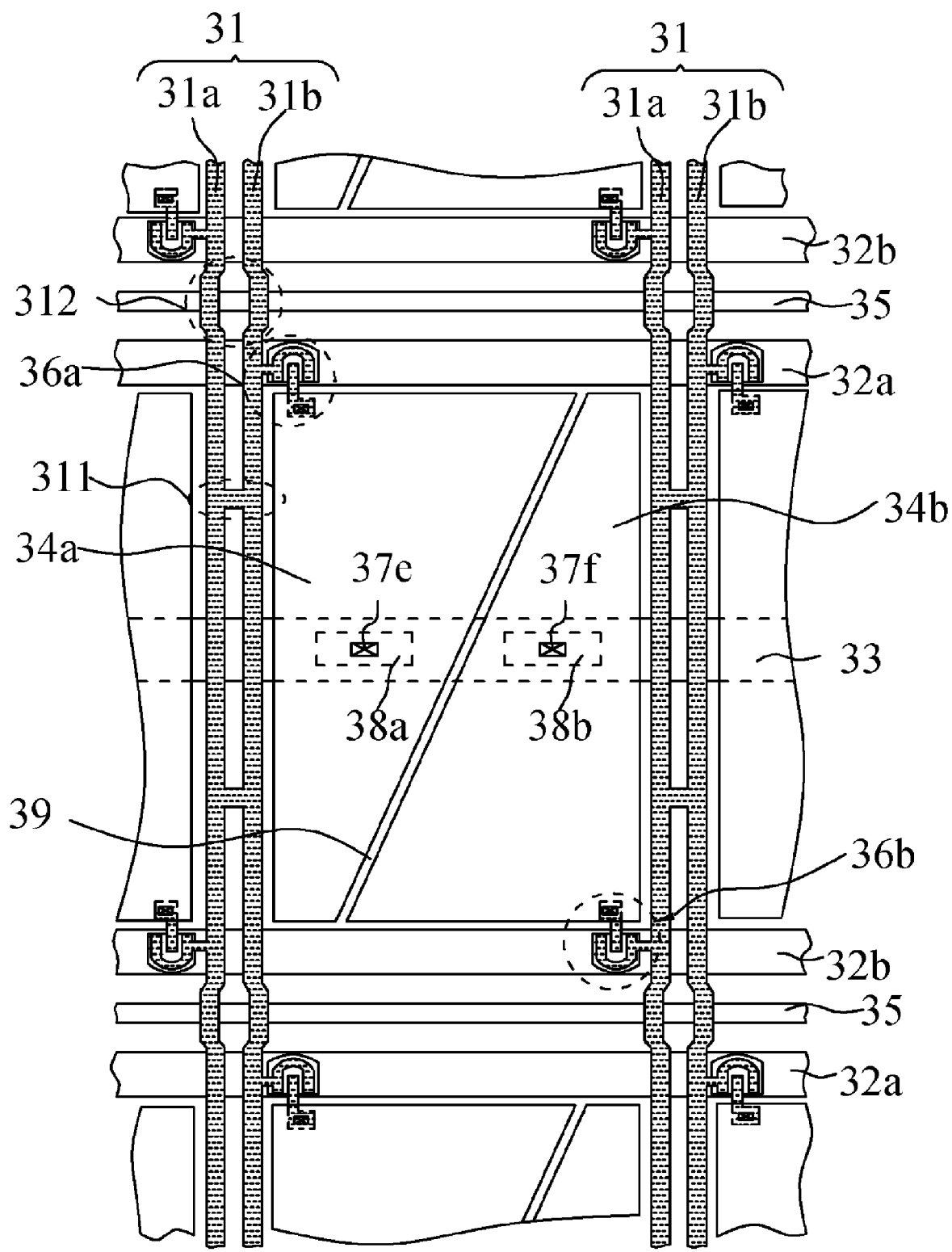
FIG. 7 shows a schematic view of an array substrate of a liquid crystal display in accordance with a second embodiment of the invention.

FIG. 7 is a schematic view showing a pixel structure on an array substrate of LCD according to another embodiment of the invention. As shown in FIG. 7, the array substrate also comprises a plurality of data lines 31 and a plurality of scan lines crossing with each other to form a plurality of pixel regions. However, different from FIG. 3, each pixel region is divided into two sub-pixel regions, that is, a first sub-pixel region in which a first sub-pixel electrode 34a is formed and a second sub-pixel region in which a second sub-pixel electrode 34b is formed. The two sub-pixel regions 34a and 34b are electrically isolated by a slit 39. A scan line corresponding to each pixel region comprises two sub-scan lines which are parallel, that is, a first scan line 32a is above the pixel region and a second scan line 32b is below the pixel region. A first thin film transistor (TFT) 36a is formed adjacent to the position where the data line 31 crosses with the first scan line 32a for controlling the first sub-pixel electrode 34a, and a second TFT 36b is formed adjacent to the position where the data line 31 crosses with the second scan line 32b for controlling the second sub-pixel electrode 34b. A storage capacitor electrode 33 is provided parallel to the first and second scan lines 32a and 32b, and beneath the layer in which the sub-pixel electrodes 34a and 34b are provided. The storage capacitor electrode 33 and the first sub-pixel electrode 34a, having a gate insulating layer and a passivation layer (both not shown) in between, to form a storage capacitor for the first sub-pixel region. The storage capacitor electrode 33 and the second sub-pixel electrode 34b, have a gate insulating layer and a passivation layer (both not shown) in between, to form a storage capacitor for the second sub-pixel region. In an embodiment, in order to increase the capacitance of the storage capacitor, a first auxiliary metal layer 38a may be provided between the storage capacitor electrode 33 and the first sub-pixel electrode 34a, and a second auxiliary metal layer 38b may be provided between the storage capacitor electrode 33 and the second sub-pixel electrode 34b. The first auxiliary metal layer is electrically connected with the first sub-pixel electrode 34a by a through hole 37e penetrating the passivation layer, and the second auxiliary metal layer is electrically connected with the second sub-pixel electrode 34b by a through hole 37f penetrating the passivation layer. The storage capacitor is well known in the art in terms of function and operation, and therefore will not be described in detail herein. In addition, both the first sub-pixel electrode 34a and the second sub-pixel electrode 34b may have a plurality of slits formed thereon so as to achieve Multi-domain Vertical Alignment of liquid crystal, for example used in an MVA LCD. FIG. 7 shows the situation around one pixel region. However, it is apparent to those of ordinary skill in the art that an array substrate typically comprises a number of pixel regions, and these pixel regions may have substantially similar structure to that shown in FIG. 7.

As shown in FIG. 7, each data line 31 comprises a plurality of branches in the embodiment. It is noted that although the data line 31 shown in FIG. 7 comprises two branches 31a and 31b, the data line 31 may comprise three, four or more branches. A first branch 31a and a second branch 31b of the data line 31 are electrically connected via a connection portion 311. The connection portion 311 is made of an electrically conducting material, which may be the same material as that for the first and second branches 31a and 31b of the data line 31, and can be formed in the same procedure as the two branches 31a and 31b of the data line 31 during manufacturing. In an embodiment, the connection portion 311 is provided at a position that does not overlap with the first scan line 32a, the second scan line 32b and the storage capacitor electrode 33, so as to prevent from degradation of display quality due to forming a capacitor with the scan line or the storage capacitor electrode 33. In addition, in the embodiment shown in FIG. 7, two connection portions 311 are provided corresponding to the data line 31 for one pixel, and are positioned respectively at both upper and lower sides of the storage capacitor electrode 33 in FIG. 7. However, the number of the connection portions 311 is not limited to two, but may be one or more.

As shown in FIG. 7, in the array substrate of the embodiment, a repair line 35 is provided extending in parallel or substantially parallel with the scan line, that is, in a non-intersecting manner, and may be provided between the first scan line 32a and the second scan line 32b of adjacent pixel. The repair line 35 may be provided in the same layer as the first scan line 32a and the second scan line 32b, and may cross the data line 31 with an insulating layer in between. In an embodiment, the two branches 31a, 31b of the data line 31 have an interval increased at a position 312 where they cross with the repair line 35. Moreover, FIG. 7 shows an embodiment in which one repair line 35 is provided between two adjacent pixels; however, more repair lines 35 may be provided between the two adjacent pixels, and these repair lines may be either electrically connected to each other or mutually separated.

Figure 8A:
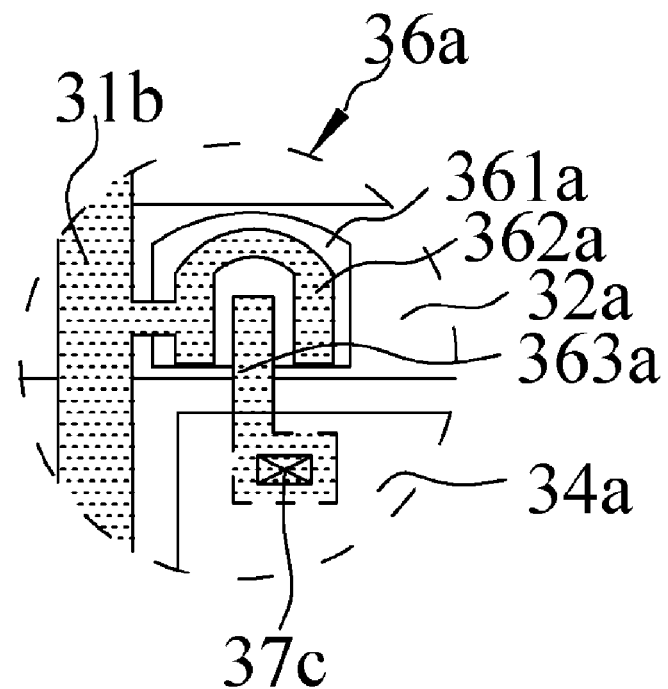
FIGS. 8A and 8B are enlarged views of regions in which thin film transistors reside in FIG. 7.

FIG. 8A is an enlarged view showing the region in FIG. 7 where the first TFT 36a is positioned. The first TFT 36a comprises a gate electrode, a semiconductor layer 361a, a source electrode 362a and a drain electrode 363a. The gate electrode of the first TFT 36a is electrically connected with the first scan line 32a, and in the embodiment shown in FIG. 8A is a part of the first scan line 32a. The source electrode 362a of the first TFT 36a is electrically connected with the data line 31, and in the embodiment is connected with the second branch 31b of the data line 31. The drain electrode 363a of the first TFT 36a is electrically connected with the first sub-pixel electrode 34a via a through hole 37c.

Figure 8B:
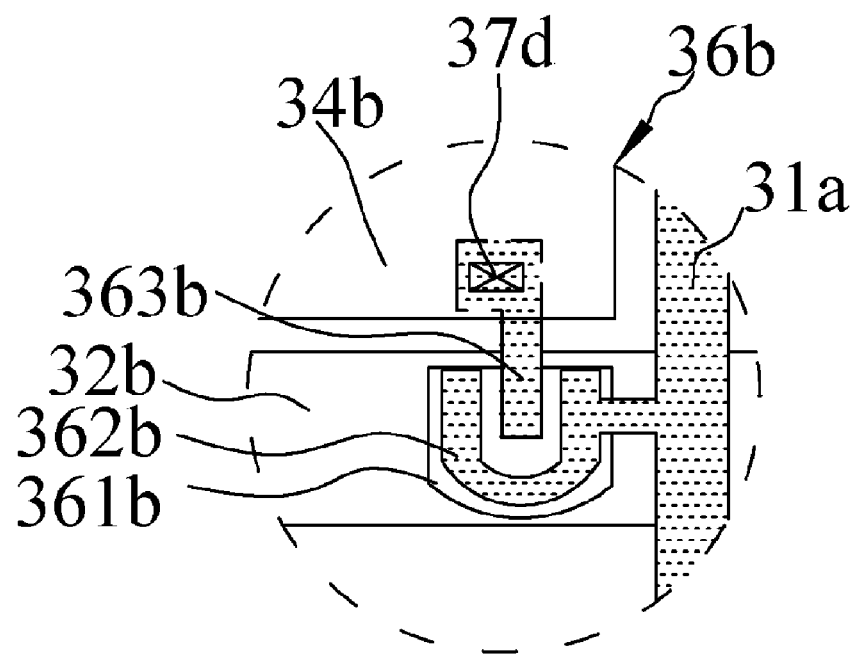

FIG. 8B is an enlarged view showing the region in FIG. 7 where the second TFT 36b is positioned. The second TFT 36b comprises a gate electrode, a semiconductor layer 361b, a source electrode 362b and a drain electrode 363b. The gate electrode of the second TFT 36b is electrically connected with the second scan line 32b, and in the embodiment shown in FIG. 8B is a part of the second scan line 32b. The source electrode 362b of the second TFT 36b is electrically connected with the data line 31, and in the embodiment is connected with the first branch 31a of a data line next to the data line 31. The drain electrode 363b of the second TFT 36b is electrically connected with the second sub-pixel electrode 34b via a through hole 37d.

It is apparent to those of ordinary skill in the art that, although the TFTs 36a and 36b are used in the embodiment to control the two sub-pixel electrodes 34a and 34b, other switching elements known in the art may be used in place of the TFTs 36a and 36b to carry out the invention. Moreover, the manner in which the first and second TFTs 36a and 36b are connected is merely illustrative, and it is possible to have other connection manners, for example, both the source electrodes may be connected to one data line.

In the embodiment, the data line 31 is provided with two branches 31a and 31b. Normally, both of the two branches 31a and 31b are configured to transmit data signals on the data line 31. If a breaking defect occurs in one of the two branches 31a and 31b of the data line 31 due to a line defect in a manufacturing process of the array substrate, the liquid crystal display can still work properly without being repaired since another branch of the data line 31 remains in normal electrical connection. If a shorting defect occurs in one of the two branches 31a and 31b of the data line 31, for example at a point where the first branch 31a crosses with the first scan line 32a and/or the second scan line 32b, the portion where the shorting defect occurs may be cut off from other portions of that branch by laser, and the signal on the data line 31 can be transmitted through another branch (in this case through the second branch 31b) and the connection portions 311. Such repair may be carried out similarly to that shown in FIG. 5A, and thus will not be described again.

Also, according to the embodiment, even when defects such as shorting or breaking occur in both of the branches 31a and 31b of the data line 31 between two adjacent connection portions 311, the data line 31 can also be repaired. FIG. 9 shows the manner in which the data line 31 is repaired when defects (such as shorting with the storage capacitor electrode 33 or breaking) occur at a position D2 (referred to as "defect position D2" hereinafter) where both of the branches 31a and 31b of the data line 31 cross with the storage capacitor electrode 33. In FIG. 9, the data line in which a defect occurs will be referred to as a first data line 31, and the first and second branches thereof will be denoted with reference numbers 31a and 31b; the data line that is next to the data line will be referred to as a second data line 31', and the first and second branches thereof will be denoted with reference numbers 31a' and 31b'; the repair line adjacent to the defect position D2 and in its upper side will be referred to as a first repair line 35, and the repair line adjacent to the defect position D2 and in its lower side will be referred to as a second repair line 35'.

In repairing the defect at the defect position D2, for both branches of the data line 31, the portions at the defect position D2 are cut off from other portions. For example, in case that both branches 31a and 31b of the first data line 31 are short with the storage capacitor electrode 33 at the defect position D2 to cause a shorting defect, the first branch 31a and the second branch 31b of the first data line 31 are cut off at an upper position C1 and a lower position C2 of the defect position D2 by laser. In case that both branches 31a and 31b of the first data line 31 break at the defect position D2 to cause a breaking defect, since the branches have been broken, they may not be subject to additional process, or may be cut off at the upper position C1 and the lower position C2 of the defect position D2 by laser, similar to the above process in handling the shorting defect, to better ensure that the defect position D2 is disconnected from other portions of the data line 31. For the situation shown in FIG. 9, the defect position D2 is between the second repair line 35' and the position where the first TFT 36a is connected to the first data line 31; in this case, the upper position C1 is between the defect position D2 and a position where the first TFT 36a is connected to the first data line 31, and the lower position C2 is between the defect position D2 and positions A1 and A2 where the first data line 31 crosses with the second repair line 35'. However, in case that the defect position D2 is between the first repair line 35 and a position where the first TFT 36a is connected to the first data line 31, the upper position C1 will be between the defect position D2 and positions A3 and A4 where the first data line 31 crosses with the first repair line 35, and the lower position C2 will be between the defect position D2 and a position where the first TFT 36a is connected to the first data line 31.

In addition, the electrical connection between the first branch 31a' and the second branch 31b' of a section of the second data line 31' is cut off, e.g., the section being between the first repair line 35 and the second repair line 35'. For example, both connection portions 311 in the section of the second data line 31' between the first repair line 35 and the second repair line 35' are cut off by laser at positions C3 and C4.

Moreover, the first repair line 35 and the second repair line 35' are made electrically connected with the first data line 31 respectively. For example, by laser melting, the first data line 31 and the second repair line 35' are made electrically connected in at least one, and preferably both, of the position A1 where the first branch 31a of the first data line 31 crosses with the second repair line 35' and the position A2 where the second branch 31b of the first data line 31 crosses with the second repair line 35', and the first data line 31 and the first repair line 35 are made electrically connected in at least one, and preferably both, of the position A3 where the first branch 31a of the first data line 31 crosses with the first repair line 35 and the position A4 where the second branch 31b of the first data line 31 crosses with the first repair line 35.

Also, the first repair line 35 and the second repair line 35', respectively, are made electrically connected with one of the plurality of branches of the second data line 31'. For example, by laser melting, the second branch 31b' of the second data line 31' and the first repair line 35 are made electrically connected at a position A5' where the second branch 31b' of the second data line 31' crosses with the first repair line 35, and the second branch 31b' of the second data line 31' and the second repair line 35' are made electrically connected at a position A6 where the second branch 31b' of the second data line 31' crosses with the second repair line 35'. Alternatively, it is also possible that the first branch 31a' of the second data line 31' and the first repair line 35 are made electrically connected at a position where the first branch 31a' of the second data line 31' crosses with the first repair line 35, and the first branch 31a' of the second data line 31' and the second repair line 35' are made electrically connected at a position where the first branch 31a' of the second data line 31' crosses with the second repair line 35'.

In addition, the branch in the second data line 31' that is electrically connected with the first repair line 35 and the second repair line 35', which is the second branch 31b' in the case shown in FIG. 9, is cut off at a position (e.g. a position C5' shown in FIG. 9) above a position where it crosses with the first repair line 35 (e.g. the position A5' shown in FIG. 9), and is cut off at a position (e.g. a position C6' shown in FIG. 9) below the position where it crosses with the second repair line 35' (e.g. the position A6' shown in FIG. 9).

In an embodiment, by laser for example, the first repair line 35 may be cut off at a position (e.g. a position C7 shown in FIG. 9) left to the leftmost position (the position A3 in case of FIG. 9) among the one or more positions where the first data line 31 is electrically connected with the first repair line 35, and the second repair line 35' may be cut off at a position (e.g. a position C9 shown in FIG. 9) left to the leftmost position (the position A1 in case of FIG. 9) among the one or more positions where the first data line 31 is electrically connected with the second repair line 35'. Furthermore, by laser for example, the first repair line 35 may be cut off at a position (e.g. a position C8' shown in FIG. 9) right to the position (the position A5' in case of FIG. 9) where the branch of the second data line 31' electrically connected to the first repair line 35 and the second repair line 35' (the second branch 31b' in case of FIG. 9) crosses with the first repair line 35, and the second repair line 35' may be cut off at a position (e.g. a position C10' shown in FIG. 9) right to the position (the position A6' in case of FIG. 9) where the branch of the second data line 31' electrically connected to the first repair line 35 and the second repair line 35' crosses with the second repair line 35'. As a result, influence of parasitic capacitance, which may be generated between the first repair line 35/the second repair line 35' and other data lines, on signals is advantageously reduced, and, since only a portion of the first repair line 35 and a portion of the second repair line 35' as shown are used, other portions of the first repair line 35 and the second repair line 35' can still be used for repair if a defect occurs in other data lines in the array substrate.

For the embodiment shown in FIG. 9, the second data line 31' includes only two branches 31a' and 31b'. In this case, by laser melting for example, the TFT (the first TFT 36a' of an adjacent pixel in case of FIG. 9) connected to the branch of the second data line 31' that is electrically connected with the first repair line 35 and the second repair line 35' (the second branch 31b' in case of FIG. 9) maybe cut off from that branch, as shown at C11 in FIG. 9. In this case, it is possible to prevent display quality from being degraded due to a source of data signal for the TFT switched from the second data line 31' to the first data line 31. However, in case that the second data line 31' comprises three branches (that is, a left branch, a middle branch and a right branch) or more, if the middle branch which is not electrically connected with any TFT is used as the branch to be electrically connected with the first repair line 35 and the second repair line 35' for repair, the electrical connection between the TFT and the corresponding branch may not be cut off as above, and the TFT can still operate normally.

With the manner described above, for the data line 31 in which the defect occurs, the portions above and below the defect position D2 can be electrically connected through the first repair line 35, the second branch 31b' of the second data line 31' and the second repair line 35', and thus the defect is repaired.

It is noted that although the repairing method above is described as several steps for the convenience of explanation, the steps in the method is not necessarily carried out in sequence. That is, electrical connection operation at respective positions A1-A4, A5' and A6', cutting off operation at respective positions C1-C4, C5' and C6', and optional cutting off operation at respective positions C7, C8', C9, C10' and C11 may be carried out simultaneously, or in any order as required. To carry out repair, only at least one of the plurality of branches in the data line 31 where a defect occurs is required to be electrically connected with the first repair line 35 and the second repair line 35'; however, it is advantageous that both branches are electrically connected with the first repair line 35 and the second repair line 35' in order to minimize the electrical resistance of the repaired data line. In addition, the embodiment shows a repair by using the second branch 31b' of the second data line 31' which is adjacent to the first data line 31 having defect. However, it is also possible to carry out repair by using the first branch 31a' of the second data line 31'. As described above in connection to FIG. 7, the two branches 31a, 31b of the data line 31 may have an interval increased at a position 312 where they cross the repair line 35, so as to facilitate electrically connecting either or both branches of the data line 31 to the repair line 35 for example by laser melting when carrying out repair without interfering or damaging any of the branches when laser melting is carried out. Similarly, the first data line 31 and the second data line 31' may comprise one or two connection portions 311 between the positions where they cross with the first repair line 35 and the second repair line 35'. However, it is not necessary that a connection portion 311 is provided for each pixel between the positions where the data line crosses with the first repair line 35 and the second repair line 35', or it is possible to provide a connection portion 311 every one or several pixels.

It is to be understood that the first scan line 32a, the second scan line 32b and the repair line 35, in terms of positional relationship, are not limited to the case shown in FIG. 7. For example, the repair line 35 may be positioned between the pixel region and the first scan line 32a, or between the pixel region and the second scan line 32b. However, the structure shown in FIG. 7 is advantageous in facilitating electrical connection between the sub-scan lines 32a, 32b and the sub-pixel electrodes 34a, 34b.

Similar to the structure shown in FIG. 6, the repair line 35 and the first scan line 32a or the second scan line 32b may be electrically connected together with an additional connection portion formed with a conductive material. The additional connection portion is cut off by for example laser merely when the repair line 35 is used to carry out repair as shown in FIG. 9. Thus when the array substrate operates normally, the repair line 35 and a sub-scan line is connected in parallel and the electrical resistance of the sub-scan line can be reduced.

It is noted that the structure of the data line in the invention is not limited to the specific case shown in the embodiments described above, as long as the data line is provided with a branch structure such that when a defect occurs, a data signal on the defective data line can be transmitted through a branch of itself or an adjacent data line. In addition, the position of the repair lines in the invention is not limited to the specific case shown in the embodiments above, as long as the repair line can be electrically connected with two adjacent data lines.

What is claimed is:

1. An array substrate of a liquid crystal display, comprising:
   a first scan line and a second scan line;
   a first data line and a second data line arranged crossing with the first scan line and the second scan line to define a pixel region;
   a first repair line and a second repair line, the first repair line crossing the first data line and the second data line with an insulating layer in between, and the second repair line crossing the first data line and the second data line with an insulating layer in between; and
   a pixel electrode in the pixel region,
   wherein the second data line comprises a first branch and a second branch electrically connected to each other.

2. The array substrate according to claim 1, wherein the first data line comprises a first branch and a second branch electrically connected.

3. The array substrate according to claim 1, wherein the first repair line and the first scan line are positioned at a first side of the pixel region in a non-intersecting manner, and the second repair line and the second scan line are positioned at a second side opposite to the first side of the pixel region in a non-intersecting manner.

4. The array substrate according to claim 3, wherein the first repair line is electrically connected with the first scan line, or the second repair line is electrically connected with the second scan line.

5. The array substrate according to claim 1, wherein the first and second branches of the second data line have a separation distance which is wider at positions where they cross the first repair line and the second repair line than at other positions where they do not cross the first repair line and the second repair line.

6. The array substrate according to claim 1, wherein the first and second branches of the second data line are electrically connected with a connection portion provided at a position that overlaps with neither the first scan line nor the second scan line.

7. The array substrate according to claim 6, further comprising a storage capacitor electrode, and wherein the connection portion is disposed at a position that does not overlap with the storage capacitor electrode.

8. The array substrate according to claim 1, wherein the pixel electrode in the pixel region comprises a first sub-pixel electrode and a second sub-pixel electrode.

9. The array substrate according to claim 8, further comprising a first thin film transistor and a second thin film transistor, wherein the first thin film transistor has a drain electrode electrically connected with the first sub-pixel electrode and a gate electrode electrically connected with the first scan line, and the second thin film transistor has a drain electrode electrically connected with the second sub-pixel electrode and a gate electrode electrically connected with the second scan line.

10. The array substrate according to claim 9, wherein the first thin film transistor has a source electrode electrically connected with the first data line, and the second thin film transistor has a source electrode electrically connected with the second data line.

11. The array substrate according to claim 8, wherein the first sub-pixel electrode and the second sub-pixel electrode respectively have a plurality of slits.

12. A liquid crystal display comprising: a plurality of scan lines and data lines crossing with each other and defining a plurality of pixel regions; a plurality of pixel electrodes in the plurality of pixel regions; a first repair line and a second repair line respectively disposed at opposite two sides of the pixel region and insulatively crossing with the data lines, wherein the data line comprises at least two branches electrically connected with each other.

13. The liquid crystal display according to claim 12, wherein the first repair line is electrically connected with the adjacent scan line of the pixel region.

14. The liquid crystal display according to claim 12, wherein a separation distance between any two of the at least two branches of the data line crossing with the first repair line and the second repair line is wider than that between any two of the at least two branches of the data line which do not cross the first repair line and the second repair line.

15. The liquid crystal display according to claim 12, wherein the at least two branches of the data line are electrically connected via a connection portion, the connection portion being disposed at a position which does not overlap with the scan line.

16. The liquid crystal display according to claim 12, wherein the pixel electrode in the pixel region comprises a first sub-pixel electrode and a second sub-pixel electrode.

17. The liquid crystal display according to claim 16, further comprising a first thin film transistor and a second thin film transistor, wherein the first thin film transistor has a drain electrode electrically connected with the first sub-pixel electrode and a gate electrode electrically connected with one scan line of the pixel region, and the second thin film transistor has a drain electrode electrically connected with the second sub-pixel electrode and a gate electrode electrically connected with the other scan line of the pixel region.

18. The liquid crystal display according to claim 17, wherein the first thin film transistor has a source electrode electrically connected with one data line of the pixel region, and the second thin film transistor has a source electrode electrically connected with the other data line of the pixel region.

* * * * *